(12) United States Patent
Zhang et al.

(10) Patent No.: US 10,715,124 B2
(45) Date of Patent: Jul. 14, 2020

(54) GLITCH-FREE CLOCK GENERATOR AND METHOD FOR GENERATING GLITCH-FREE CLOCK SIGNAL

(71) Applicant: NXP USA, INC., Austin, TX (US)

(72) Inventors: Bin Zhang, Suzhou (CN); Jianluo Chen, Suzhou (CN); Yan Huang, Suzhou (CN); Hongyan Yao, Suzhou (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/438,481

(22) Filed: Jun. 12, 2019

(65) Prior Publication Data

US 2020/0091901 A1 Mar. 19, 2020

(30) Foreign Application Priority Data

Sep. 14, 2018 (CN) .......................... 2018 1 1078553

(51) Int. Cl.
*H03K 5/1252* (2006.01)
*G06F 1/06* (2006.01)
*H03K 3/037* (2006.01)
*H03K 19/20* (2006.01)

(52) U.S. Cl.
CPC .............. *H03K 5/1252* (2013.01); *G06F 1/06* (2013.01); *H03K 3/037* (2013.01); *H03K 19/20* (2013.01)

(58) Field of Classification Search
CPC ...... H03K 5/1252; H03K 3/037; H03K 19/20; G06F 1/06

USPC .......................................................... 327/225
See application file for complete search history.

(56) References Cited

U.S. PATENT DOCUMENTS

| | | | |
|---|---|---|---|
| 6,337,649 B1 * | 1/2002 | Becker | H03K 5/1252 327/34 |
| 6,566,939 B1 | 5/2003 | Berka et al. | |
| 6,894,540 B1 | 5/2005 | Ali et al. | |
| 7,339,404 B2 | 3/2008 | Kimura | |
| 7,653,167 B2 | 1/2010 | Song et al. | |
| 7,659,757 B2 * | 2/2010 | Sleigh | G06F 1/04 327/141 |
| 8,180,007 B2 | 5/2012 | Iqbal et al. | |
| 8,487,647 B2 | 7/2013 | Rodriguez et al. | |
| 8,558,579 B2 | 10/2013 | Zhang | |
| 2006/0082391 A1 | 4/2006 | Hsu et al. | |
| 2010/0321066 A1 * | 12/2010 | Yamaguchi | H03K 5/1252 326/93 |
| 2011/0175758 A1 * | 7/2011 | Iqbal | H03K 5/1252 341/94 |

(Continued)

*Primary Examiner* — John W Poos (57) ABSTRACT

A clock generator that generates an output clock signal, includes a clock generating circuit that generates an internal clock signal, first and second filter circuits, and an output gate. The first filter circuit receives the internal clock signal and an enable signal, and provides a first filtered enable signal in response to the enable signal having a duration of at least two cycles of the clock signal. The second filter circuit receives the first filtered enable signal, provides a second filtered enable signal in response to the first filtered enable signal, and provides a delayed signal that is a delayed version of the second filtered enable signal. The output gate receives the internal clock signal from the clock generating circuit and the second filtered enable signal from the second filter circuit, and generates the output clock signal.

17 Claims, 3 Drawing Sheets

(56) References Cited

U.S. PATENT DOCUMENTS

2012/0200316 A1* 8/2012 Suzuki ................ H03K 5/1252
326/52

* cited by examiner

GLITCH-FREE CLOCK GENERATOR AND METHOD FOR GENERATING GLITCH-FREE CLOCK SIGNAL

BACKGROUND

The present invention generally relates to clock generators, and, more particularly, to clock signal generating circuits that filter out glitches in input signals and a method for generating glitch-free clock signals.

Clock generators are used for providing clock signals for various circuits. In some circuits, the clock signals are provided in response to enable signals. However, since the enable signals are provided from various other circuits, the enable circuits may have glitches. As is well understood, glitches can cause circuits to operate incorrectly and in some cases, even fail.

It would be advantageous to have a glitch-free clock generator and a method therefor.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides a clock generator that generates an output clock signal, and includes a clock generating circuit that generates an internal clock signal, first and second filter circuits, and an output gate. The first filter circuit receives the internal clock signal and an enable signal, and provides a first filtered enable signal in response to the enable signal having a duration of at least two cycles of the internal clock signal. The second filter circuit receives the first filtered enable signal, provides a second filtered enable signal in response to the first filtered enable signal, and provides a delayed signal that is a delayed version of the second filtered enable signal. The output gate receives the internal clock signal from the clock generating circuit and the second filtered enable signal from the second filter circuit, and generates the output clock signal.

In another embodiment, the present invention provides a method for generating a glitch-free clock signal. The method includes the steps of generating, by a clock generating circuit, an internal clock signal; receiving, by a first filter circuit, the internal clock signal and an enable signal; generating, by the first filter circuit, a first filtered enable signal in response to the enable signal having a duration of at least two cycles of the internal clock signal; receiving, by a second filter circuit, the first filtered enable signal; generating, by the second filter circuit, a second filtered enable signal in response to the first filtered enable signal; providing, by the second filter circuit, a delayed signal, which is a delayed version of the second filtered enable signal; receiving, by an output gate, the internal clock signal and the second filtered enable signal; and providing, by the output gate, the glitch-free clock signal based on a first logic operation and the second filtered enable signal.

In yet another embodiment, the present invention provides a clock generator for generating an output clock signal in response to an enable signal. The clock generator includes a clock generating circuit that generates an internal clock signal, first and second filter circuits, and an output gate. The first filter circuit receives the internal clock signal and the enable signal, and provides a first filtered enable signal indicative of a first validity of the enable signal. The second filter circuit receives the first filtered enable signal and generates a second filtered enable signal, and applies a delay on the second filtered enable signal to generate a delayed signal. The clock generating circuit operates in response to the second filtered enable signal and the delayed signal. The output gate receives the second filtered enable signal and the internal clock signal, and generates the output clock signal.

BRIEF DESCRIPTION OF THE DRAWINGS

So that the manner in which the above recited features of the present invention can be understood in detail, a more detailed description of the invention may be had by reference to embodiments, some of which are illustrated in the appended drawings. The appended drawings illustrate only typical embodiments of the invention and should not limit the scope of the invention, as the invention may have other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
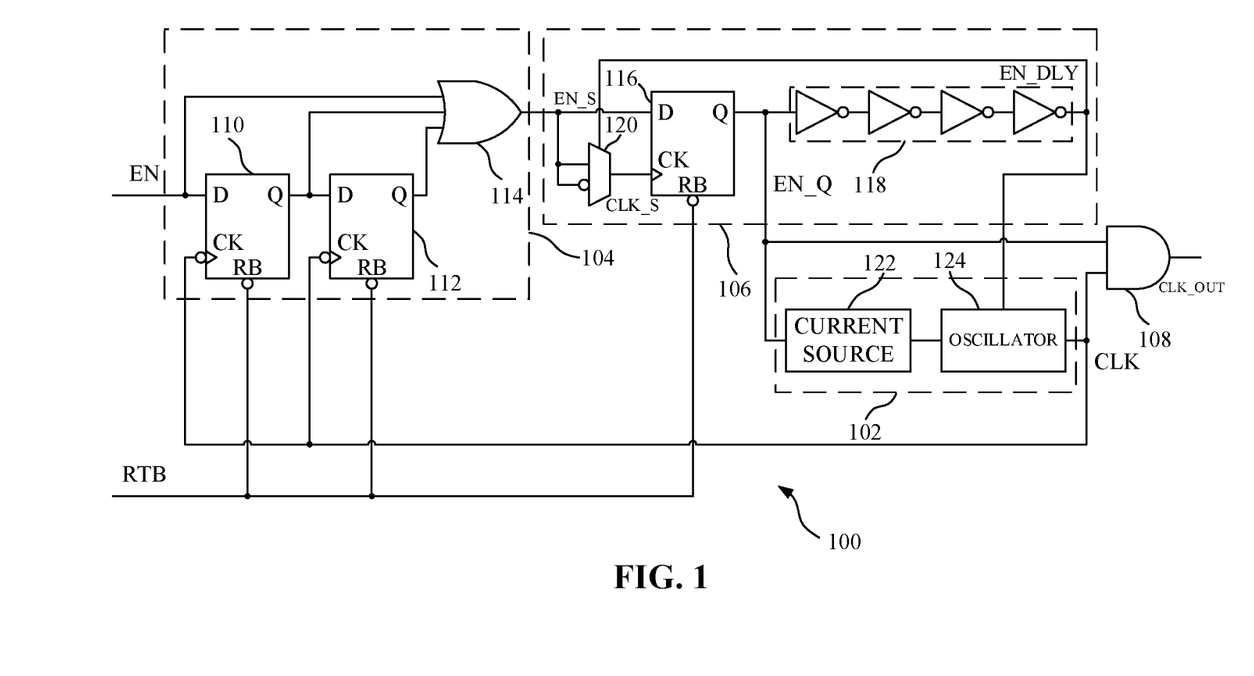
FIG. 1 is a schematic circuit diagram of a clock generator according to an embodiment of the present invention.

Referring to FIG. 1, a schematic circuit diagram of a clock generator 100 according to an exemplary embodiment of the present invention is shown. The clock generator 100 includes a clock generating circuit 102, a first filter circuit 104, a second filter circuit 106, and an output gate 108. The clock generating circuit 102 is configured to generate a clock signal CLK. In the presently preferred embodiment, the clock generating circuit 102 is an analog clock generator that generates "raw" clock signals that are provided as an output clock signal CLK_OUT of the clock generator 100 by the output gate 108 under control of an enable signal EN.

The first filter circuit 104 includes a first latch 110, a second latch 112, and a logic gate 114. The first latch 110 has a clock input terminal CK, a data input terminal D, and a data output terminal Q. The clock input terminal CK of the first latch 110 receives the clock signal CLK from the clock generating circuit 102; the data input terminal D receives the enable signal EN, and the data output terminal Q provides a first latched signal in response to the clock signal CLK and the enable signal EN.

Similarly, the second latch 112 includes a clock input terminal CK, a data input terminal D, and a data output terminal Q. The clock input terminal CK of the second latch 112 receives the clock signal CLK from the clock generating circuit 102; the data input terminal D receives the first latched signal from the first latch 110; and the data output terminal Q provides a second latched signal in response to the clock signal CLK and the first latched signal.

In the presently preferred embodiment, each of the first and second latches is implemented to include a flip-flop, for example a D-type flip-flop. However, in other embodiments, the first and second latches can be implemented as other types of latches, flip-flops, etc. The first and second latches 110 and 112 perform latch operations and output latched signals on falling edges of the clock signal CLK.

The logic gate 114 has a first input terminal that receives the first latched signal from the first latch 110, a second input terminal that receives the second latched signal from the second latch 112, and a third input terminal that receives the enable signal EN. The logic gate 114 applies an OR operation on the input signals, to generate a first filtered enable signal EN_S of the first filter circuit 104. The OR operation on the enable signal EN itself, the first latched signal from the first latch 110, which is a status of the enable signal EN in the previous clock cycle, and the second latched signal from the second latch 112, which is the status of the enable signal EN two clock cycles prior, ensures that the enable signal EN is propagated as a valid enable signal only if the enable signal EN has a duration of at least 2 cycles of the clock signal CLK.

The second filter circuit 106 receives the first filtered enable signal EN_S from the first filter circuit 104 and generates a second filtered enable signal EN_Q as a response. The second filter circuit 106 includes a third latch 116, a delay circuit 118, and a selector circuit 120.

The third latch 116 has a data input terminal D that receives the first filtered enable signal EN_S from the first filter circuit 104, a clock terminal CK that receives a clock signal CK_S output by the selector circuit 120, and a data output terminal Q that provides a third latched signal as the second filtered enable signal EN_Q of the second filter circuit 106. Similar to the first and second latches 110 and 112, the third latch 116 can be implemented as a flip-flop, such as a D-type flip-flop. The third latch 116 provides the third latched signals EN_Q on rising edges of the input clock signal CLK_S. As shown in FIG. 1, the second filtered enable signal EN_Q is used to enable the clock generating circuit 102.

The delay circuit 118 applies delays the second filtered enable signal EN_Q, to provide a delayed signal EN_DLY. The delay circuit 118 can be implemented various ways, for example multiple series connected inverters (NOT gates) in the current embodiment.

The selector circuit 120 receives the delayed signal EN_DLY as a selection signal and receives the first filtered enable signal EN_S and its inverted version respectively on first and second data input terminals thereof. The selector circuit 120 provides either the first filtered enable signal EN_S or the inverted version of the first filtered enable signal as an output in response to the received selection signal EN_DLY. The output of the selector circuit 120 is provided to the clock input terminal of the third latch 116, as noted above.

The clock generating circuit 102 includes a current source 122 and an oscillator 124. The current source 122 receives the second filtered enable signal EN_Q, which operates to enable the current source 122 such that the current source 122 generates a source current. The source current is received by the oscillator 124. The oscillator 124 receives the delayed signal EN_DLY as an enable signal and, when enabled, generates the clock signal CLK. The current source 122 has a setting time before the source current reaches an operation level. In the presently preferred embodiment, a delay time introduced by the delay circuit 118 is longer than the setting time of the current source 122. In one embodiment, the setting time of the current source 122 is around 4.3 µs.

The output gate 108 has a first input terminal that receives the second filtered enable signal EN_Q from the third latch 116, and a second input terminal that receives the clock signal CLK from the oscillator 124 of the clock generating circuit 102. The output gate 108 generates a final output clock signal CLK_OUT as a response. In the presently preferred embodiment, the output gate 108 comprises an AND gate. In the presently preferred embodiment, the output clock signal CLK_OUT follows the clock signal CLK if the delayed signal EN_DLY is high.

As shown in FIG. 1, each of the first to third latches 110, 112, and 116 has a reset terminal RB that receives a reset bit RTB. A valid reset bit RTB resets the output terminals Q of the latches. It is understood that, during the operations of the latches, the reset bit RTB is not valid.

The operation of the clock generator 100 will be described with reference to the timing diagrams of FIGS. 2 and 3.

Figure 2:
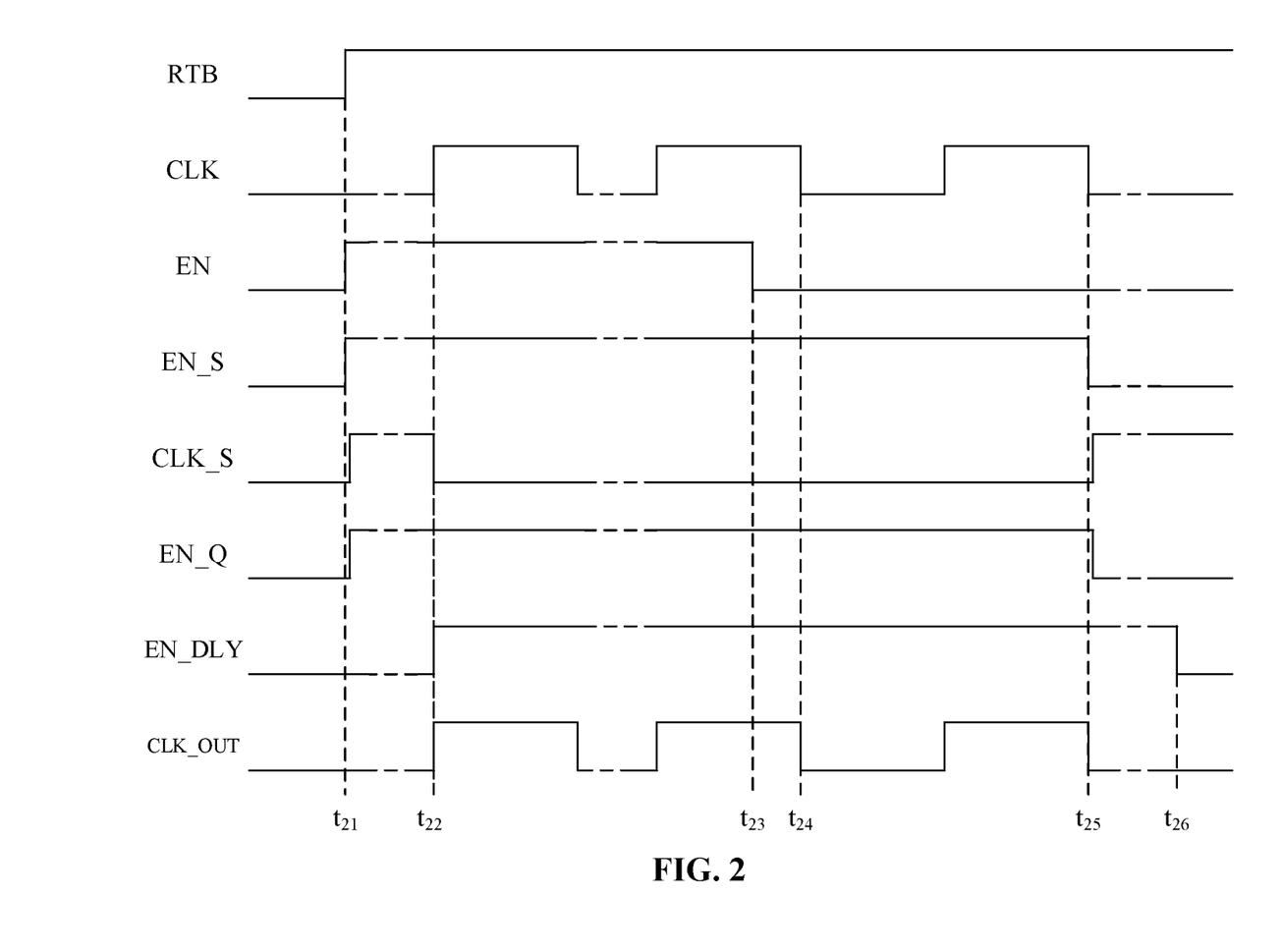
FIG. 2 is a timing diagram of signals in the clock generator of FIG. 1 during normal operations where the enable signal EN goes from a low state to a high state and from a high state to a low state.

FIG. 2 depicts the timing of multiple signals in the clock generator 100 during a normal operation in which the enable signal EN transitions from "0" to "1" and from "1" to "0".

In a standby mode, the reset bit RTB provided to the first to third latches 110, 112, and 116 is low state so the outputs of the latches 110, 112, and 116 are reset to low states. Because the third latched signal EN_Q provided by the third latch 116 is at a low state, the output clock signal CLK_OUT is at a low state, which means there is no clock output from the clock generator 100.

At time $t_{21}$, the reset bit RTB and the enable signal EN jump to a high state. The high state enable signal EN pulls up the first filtered signal EN_S of the first logic gate 114 to a high state. The selector circuit 120 chooses the high state signal EN_S as its selected output signal CLK_S which shows a jump from the low state to the high state. The third latch 116 accordingly provides the third latched signal EN_Q at a high state. The third latched signal EN_Q activates the current source 122 of the clock generating circuit 102 to setup. However, as shown in FIG. 2, the oscillator 124 of the clock generating circuit 102 is not enabled due to the delayed signal EN_DLY being in a low state. After the delay time passes at time $t_{22}$, the delayed signal EN_DLY jumps to high state and enables the oscillator 124 to generate the clock signal CLK. Since the second filtered enable signal EN_Q is at the high state, the output gate 108 provides the clock signal CLK as the output clock signal CLK_OUT. After the clock generating circuit 102 starts its normal operation, the clock generator 100 provides the output clock signal CLK_OUT in pace with the clock signal CLK. It can be seen that there is no glitch in the output clock signal CLK_OUT.

At time $t_{23}$, the enable signal EN jumps from the high state to the low state. The low state enable signal EN is latched by the first latch 110 at a next falling edge $t_{24}$ of the clock signal CLK. The first latched signal provided at the first data output terminal of the first latch 110 is further latched by the second latch 112 at a following falling edge $t_{25}$ of the clock signal CLK. If the enable signal EN keeps the low state for the following two falling edges of the clock signal CLK, the first filtered enable signal EN_S provided from the first logic gate 114 will jump to the low state at the second falling edge $t_{25}$. An inverted version of the low-state first filtered enable signal EN_S is provided by the selector circuit 120 as the selected signal CLK_S, which shows a jump from low to high. With a rising edge in the clock signal CLK_S, the third latch 116 provides a status of the first filtered enable signal EN_S before this rising edge, which is a low state, as the third latched signal EN_Q. The low-state second filtered enable signal EN_Q is provided to the clock generating circuit 102 to stop the clock generation. On the other hand, with the low-state second filtered enable signal EN_Q being provided to the output gate 108, the output clock signal CLK_OUT provided by the output gate 108 is almost immediately pulled down to the low state at the time $t_{25}$. As shown in FIG. 2, since the delay circuit would take a delay time to pass the low state from the second filtered enable signal EN_Q to the delayed signal EN_DLY, the delayed signal EN_DLY would not jump down from the high state until the time $t_{26}$. However, the low-state second filtered enable signal EN_Q at the low state would prohibit the output clock signal CLK_OUT from producing any glitch before the clock generating circuit 102 can generate a next clock. The delay time applying on the second filtered enable signal EN_Q is longer than the setting time of the current source 122 of the clock generating circuit 102, which means the clock signal CLK_S for the third latch 116 will not show a rising edge to pull the third latched signal EN_Q up to start the clock generating circuit 102, thereby ensures that there is no glitch in the output clock signal CLK_OUT.

Figure 3:
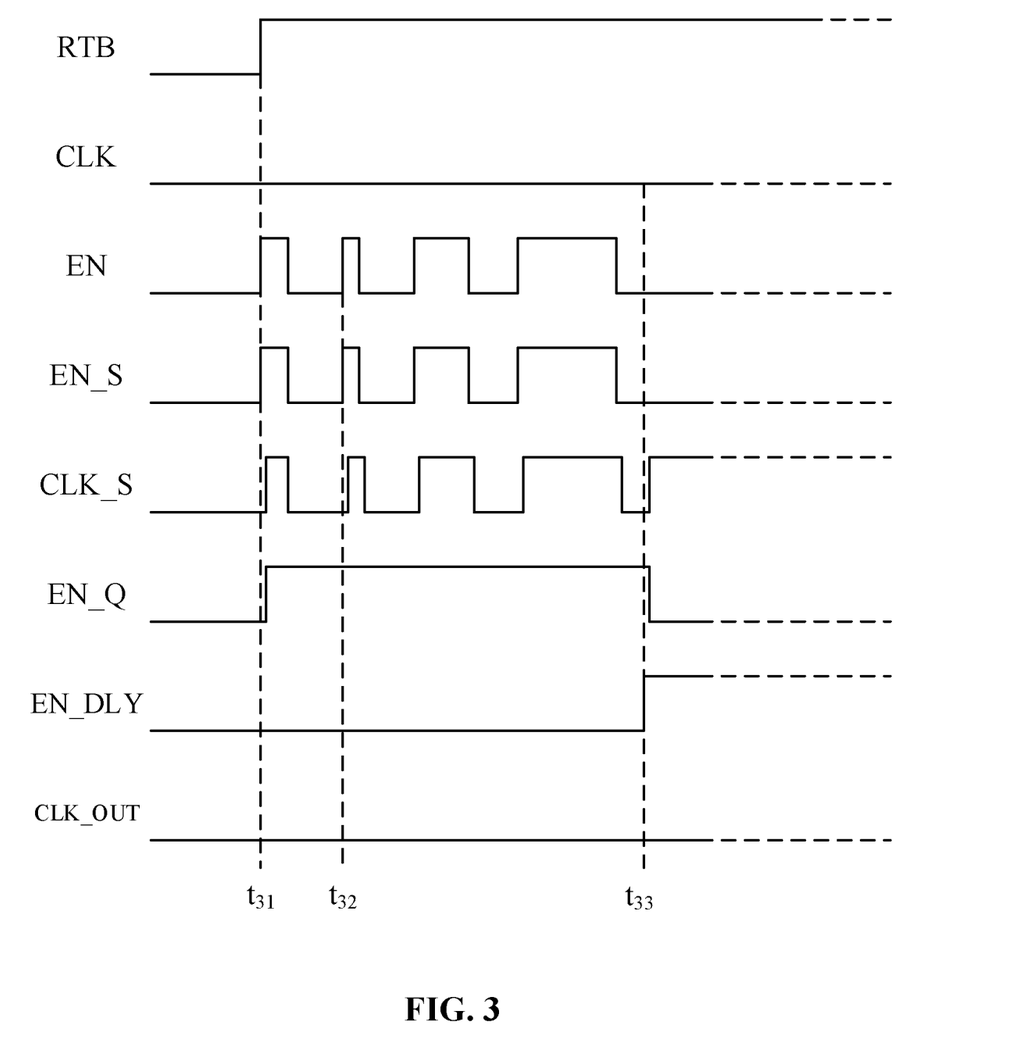
FIG. 3 is a timing diagram of signals in the clock generator of FIG. 1 during abnormal operations where the enable signal EN goes from a low state to a high state with glitches.

FIG. 3 is a timing diagram of the signals at nodes in the clock generator 100 of FIG. 1 when the enable signal EN goes from "0" to "1" with glitches. At time $t_{31}$, the enable signal EN goes to the high state and is subsequently followed by glitches. The high state of the enable signal EN is propagated to the first filtered enable signal EN_S by the first logic gate 114. Because the delayed signal EN_DLY, acting as the selection signal for the selector circuit 120, takes at least the delay time to change before it goes to high from the low state, the first filtered enable signal EN_S will be selected as the output as long as the high state of the enable signal EN is maintained for a setting time of the third latch 116. The third latch 116, at the rising edge of the output signal CLK_S from the selector circuit 120, provides the high state of the first filtered enable signal EN_S before the rising edge as the second filtered enable signal EN_Q.

It is understood that, before the delay time of the delay circuit 118 passes, the delayed signal EN_DLY stays low. Accordingly, since the third latch 118 determines the second filtered enable signal EN_Q at each rising edge of the clock input signal CLK_S, which is a slight delay over the data input signal EN_S, the data output signal EN_Q of the third latch 118 will be locked at the high state because the rising edge of the clock input signal CLK_S (also the data input signal EN_S) always means that a state right before such rising edge is a high state, as shown at a next glitch time $t_{32}$. At the output logic gate 108, because the delayed signal EN_DLY is waiting for the delay time to jump to the high state and thus the oscillator 124 is not enabled, the final output clock signal CLK_OUT is not influenced by the glitches in the enable signal EN.

The delayed signal EN_DLY goes to the high state after the delay time and at the time $t_{33}$. The high-state delayed signal EN_DLY, also provided to the selector circuit 120 as the selection signal, enables the selector circuit 120 to provide an inverted version of the first filtered enable signal EN_S as the output CLK_S. Accordingly, depending on the status of the enable signal EN and subsequently the first filtered enable signal EN_S, the clock signal CLK_S provided to the third latch 116 may go high, low, or not change. It is understood that either there is no change in state or the falling signal would not change the output of the third latch 116. While for the rising signal as shown at the time $t_{33}$, which indicates the first filtered enable signal EN_S is at the low state, the inverted version of the first filtered enable signal EN_S will be provided as the third latched signal EN_Q, which is at a low state. This low state of the second filtered enable signal EN_Q disables the clock generating circuit 102 from generating the clock signal CLK. It is seen that during the glitches of the enable signal EN, there is no output clock signal CLK_OUT, which means the output clock signal CLK_OUT is not negatively impacted by the glitches in the enable signal EN. In the presently preferred embodiment, the fade-out time of the current source 122 is around 1.3 μs. It can now be seen from FIG. 3 that the clock generator 100 requires the enable signal EN to stay at a valid enabling state for at least the delay time of the delay circuit 118 before the output clock signal CLK_OUT can be provided, while any glitch in the enable signal EN can be filtered by the first and second filter circuits 104 and 106.

On the other hand, if the enable signal EN has glitches after the output clock signal CLK_OUT starts to be provided, it is understood from FIG. 2 that the clock signal CLK will not be stopped unless the enable signal EN stays at the low state for 2 clock cycles.

The operation of the clock generator 100 in which the enable signal EN goes from the high state to the low state with glitches will now be explained. As described with reference to FIG. 1, the low state enable signal EN has a duration of at least two falling edges of the clock signal CLK before the first filtered enable signal EN_S goes low. The falling edge of the first filtered enable signal EN_S results in a rising edge in the selected signal CLK_S, which is further provided to the third latch 116. The third latch 116 accordingly provides the low-state first filtered enable signal EN_S as the third latched signal EN_Q. The third latched signal EN_Q with the low state immediately stops the current source 122 of the clock generating circuit 102 from providing the source current to generate the clock signal. As described above, the clock generating circuit 102 enters the standby mode after the low-state enable signal EN passes the duration of the two falling edges of the clock signal CLK. After that, the clock generating circuit 102 will need the setting time of around 4.3 μs to restart providing the source current for the generation of the clock signal.

The clock generator 100 includes the first filter circuit 104 to filter out glitches in the enable signal EN to ensure the high state of the enable signal is provided to the first filtered enable signal EN_S for activating the clock generating circuit. The second filter circuit 106 of the clock generator 100 ensures the clock generating circuit 102 is deactivated when the enable signal EN goes to the low state, regardless of any glitches in the enable signal. The output clock signal CLK_OUT has no glitches.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A clock generator that generates an output clock signal, comprising:
    a clock generating circuit that generates an internal clock signal;
    a first filter circuit that receives the internal clock signal and an enable signal, and generates a first filtered enable signal in response to the enable signal having a duration of at least two cycles of the internal clock signal;
    a second filter circuit that receives the first filtered enable signal, generates a second filtered enable signal in response to the first filtered enable signal, and generates a delayed signal that is a delayed version of the second filtered enable signal; and
    an output gate that receives the internal clock signal from the clock generating circuit and the second filtered enable signal from the second filter circuit, and generates the output clock signal,
    wherein the first filter circuit comprises:
        a first flip-flop having a first clock input terminal that receives the internal clock signal, a first data input terminal that receives an enable signal, and a first data output terminal that provides a first latched signal in response to the internal clock signal and the enable signal;
        a second flip-flop having a second clock input terminal that receives the internal clock signal, a second data input terminal that receives the first latched signal from the first flip-flop, and a second data output terminal that provides a second latched signal in response to the internal clock signal and the first latched signal; and
        a logic gate that receives the first latched signal, the second latched signal, and the enable signal, and generates the first filtered enable signal.

2. A clock generator that generates an output clock signal, comprising:
    a clock generating circuit that generates an internal clock signal;
    a first filter circuit that receives the internal clock signal and an enable signal, and generates a first filtered enable signal in response to the enable signal having a duration of at least two cycles of the internal clock signal;
    a second filter circuit that receives the first filtered enable signal, generates a second filtered enable signal in response to the first filtered enable signal, and generates a delayed signal that is a delayed version of the second filtered enable signal; and
    an output gate that receives the internal clock signal from the clock generating circuit and the second filtered enable signal from the second filter circuit, and generates the output clock signal,
    wherein the second filter circuit comprises:
        a flip-flop circuit that receives the first filtered enable signal from the first filter circuit, and provides a latched enable signal as the second filtered enable signal, wherein the latched enable signal is a latched version of the first filtered enable signal; and
        a delay circuit that receives the latched enable signal, and provides the delayed signal, and
    wherein the clock generating circuit comprises:
        a current source that is enabled in response to the second filtered enable signal and generates a source current; and
        an oscillator that receives the source current and generates the internal clock signal, wherein the oscillator is enabled in response to the delayed signal.

3. The clock generator of claim 2, wherein a delay time introduced by the delay circuit is longer than a setting time of the current source.

4. A clock generator that generates an output clock signal, comprising:
    a clock generating circuit that generates an internal clock signal;
    a first filter circuit that receives the internal clock signal and an enable signal, and generates a first filtered enable signal in response to the enable signal having a duration of at least two cycles of the internal clock signal;
    a second filter circuit that receives the first filtered enable signal, generates a second filtered enable signal in response to the first filtered enable signal, and generates a delayed signal that is a delayed version of the second filtered enable signal; and
    an output gate that receives the internal clock signal from the clock generating circuit and the second filtered enable signal from the second filter circuit, and generates the output clock signal,
    wherein the second filter circuit comprises:
        a flip-flop circuit that receives the first filtered enable signal from the first filter circuit, and provides a latched enable signal as the second filtered enable signal, wherein the latched enable signal is a latched version of the first filtered enable signal; and
        a delay circuit that receives the latched enable signal, and provides the delayed signal, and
    wherein the second filter circuit further comprises a selector circuit that receives the delayed signal as a selection signal, and the first filtered enable signal and an inverted version of the first filtered enable signal as data signals, and provides the first filtered enable signal or its inverted version as an output in response to the selection signal.

5. The clock generator of claim 4, wherein the output of the selector circuit is provided to the flip-flop circuit as a clock signal for the flip-flop circuit.

6. A clock generator that generates an output clock signal, comprising:
a clock generating circuit that generates an internal clock signal;
a first filter circuit that receives the internal clock signal and an enable signal, and generates a first filtered enable signal in response to the enable signal having a duration of at least two cycles of the internal clock signal;
a second filter circuit that receives the first filtered enable signal, generates a second filtered enable signal in response to the first filtered enable signal, and generates a delayed signal that is a delayed version of the second filtered enable signal; and
an output gate that receives the internal clock signal from the clock generating circuit and the second filtered enable signal from the second filter circuit, and generates the output clock signal,
wherein the output gate comprises an AND gate.

7. The clock generator of claim 6, wherein the second filter circuit comprises:
a flip-flop circuit that receives the first filtered enable signal from the first filter circuit, and provides a latched enable signal as the second filtered enable signal, wherein the latched enable signal is a latched version of the first filtered enable signal; and
a delay circuit that receives the latched enable signal, and provides the delayed signal.

8. A method for generating a glitch-free clock signal, comprising:
generating, by a clock generating circuit, an internal clock signal;
receiving, by a first filter circuit, the internal clock signal and an enable signal;
generating, by the first filter circuit, a first filtered enable signal in response to the enable signal having a duration of at least two cycles of the internal clock signal;
receiving, by a second filter circuit, the first filtered enable signal;
generating, by the second filter circuit, a second filtered enable signal in response to the first filtered enable signal;
providing, by the second filter circuit, a delayed signal that is a delayed version of the second filtered enable signal;
receiving, by an output gate, the internal clock signal and the second filtered enable signal; and
providing, by the output gate, the glitch-free clock signal based on a first logic operation of the internal clock signal and the second filtered enable signal,
wherein the generating the first filtered enable signal comprises:
latching, by a first flip-flop circuit, the enable signal;
generating, by the first flip-flop circuit, a first latched signal;
latching, by a second flip-flop circuit, the first latched signal;
generating, by the second flip-flop circuit, a second latched signal;
receiving, by a logic gate, the first latched signal, the second latched signal, and the enable signal; and
generating, by the logic gate, the first filtered enable signal based on a second logic operation of the first latched signal, the second latched signal, and the enable signal.

9. A method for generating a glitch-free clock signal, comprising:
generating, by a clock generating circuit, an internal clock signal;
receiving, by a first filter circuit, the internal clock signal and an enable signal;
generating, by the first filter circuit, a first filtered enable signal in response to the enable signal having a duration of at least two cycles of the internal clock signal;
receiving, by a second filter circuit, the first filtered enable signal;
generating, by the second filter circuit, a second filtered enable signal in response to the first filtered enable signal;
providing, by the second filter circuit, a delayed signal that is a delayed version of the second filtered enable signal;
receiving, by an output gate, the internal clock signal and the second filtered enable signal;
providing, by the output gate, the glitch-free clock signal based on a first logic operation of the internal clock signal and the second filtered enable signal;
enabling a current source of the clock generating circuit in response to the second filtered enable signal to provide a source current;
receiving, by an oscillator of the clock generating circuit, the source current; and
enabling the oscillator in response to the delayed signal to generate the internal clock signal.

10. The method of claim 9, wherein the providing the delayed signal comprises:
delaying, by a delay circuit, the second filtered enable signal by a delay time, wherein the delay time is longer than a setting time of the current source of the clock generating circuit.

11. A method for generating a glitch-free clock signal, comprising:
generating, by a clock generating circuit, an internal clock signal;
receiving, by a first filter circuit, the internal clock signal and an enable signal;
generating, by the first filter circuit, a first filtered enable signal in response to the enable signal having a duration of at least two cycles of the internal clock signal;
receiving, by a second filter circuit, the first filtered enable signal;
generating, by the second filter circuit, a second filtered enable signal in response to the first filtered enable signal;
providing, by the second filter circuit, a delayed signal that is a delayed version of the second filtered enable signal;
receiving, by an output gate, the internal clock signal and the second filtered enable signal; and
providing, by the output gate, the glitch-free clock signal based on a first logic operation of the internal clock signal and the second filtered enable signal,
wherein the generating the second filtered enable signal comprises:
receiving, by a third flip-flop circuit, the first filtered enable signal;
latching, by the third flip-flop circuit, the first filtered enable signal;
generating, by the third flip-flop circuit, a latched enable signal as the second filtered enable signal.

12. The method of claim 11, further comprises:
receiving, by a selector circuit, the delayed signal, the first filtered enable signal, and an inverted version of the first filtered enable signal; and providing, by the selector circuit, the first filtered enable signal or the inverted version of the first filtered enable signal as an output of the selector circuit based on the delayed signal.

13. The method of claim 12, further comprises:
receiving the output of the selector circuit as a clock signal for the third flip-flop circuit.

14. A clock generator for generating an output clock signal in response to an enable signal, comprising:
a clock generating circuit that generates an internal clock signal;
a first filter circuit that receives the internal clock signal and the enable signal, and generates a first filtered enable signal indicative of a first validity of the enable signal;
a second filter circuit that receives the first filtered enable signal and generates a second filtered enable signal, wherein the second filter circuit applies a delay on the second filtered enable signal to generate a delayed signal, wherein the clock generating circuit operates in response to the second filtered enable signal and the delayed signal; and
an output gate that receives the second filtered enable signal and the internal clock signal, and generates the output clock signal,
wherein the first filter circuit comprises:
a first flip-flop that latches the enable signal based on the internal clock signal, and provides a first latched enable signal;
a second flip-flop that receives and latches the first latched enable signal based on the internal clock signal, and provides a second latched enable signal; and
a first logic gate that generates the first filtered enable signal using the enable signal, the first latched enable signal, and the second latched enable signal.

15. A clock generator for generating an output clock signal in response to an enable signal, comprising:
a clock generating circuit that generates an internal clock signal;
a first filter circuit that receives the internal clock signal and the enable signal, and generates a first filtered enable signal indicative of a first validity of the enable signal;
a second filter circuit that receives the first filtered enable signal and generates a second filtered enable signal, wherein the second filter circuit applies a delay on the second filtered enable signal to generate a delayed signal, wherein the clock generating circuit operates in response to the second filtered enable signal and the delayed signal; and
an output gate that receives the second filtered enable signal and the internal clock signal, and generates the output clock signal,
wherein the second filter circuit comprises:
a selector circuit having data input terminals that receive the first filtered enable signal and an inverted version of the first filtered enable signal, and a selector input terminal that receives the delayed signal from the second filter circuit; and
a flip-flop having a data input terminal that receives the first filtered enable signal, and a clock input terminal that receives an output signal of the selector circuit, wherein the flip-flop provides a latched enable signal as the second filtered enable signal.

16. A clock generator for generating an output clock signal in response to an enable signal, comprising:
a clock generating circuit that generates an internal clock signal;
a first filter circuit that receives the internal clock signal and the enable signal, and generates a first filtered enable signal indicative of a first validity of the enable signal;
a second filter circuit that receives the first filtered enable signal and generates a second filtered enable signal, wherein the second filter circuit applies a delay on the second filtered enable signal to generate a delayed signal, wherein the clock generating circuit operates in response to the second filtered enable signal and the delayed signal; and
an output gate that receives the second filtered enable signal and the internal clock signal, and generates the output clock signal,
wherein the clock generating circuit comprises:
a current source that receives and operates in response to the second filtered enable signal to provide a source current; and
an oscillator that receives the source current and the delayed signal, wherein the oscillator is enabled in response to the delayed signal to generate the internal clock signal.

17. The clock generator of claim 16, wherein the delay applied on the second filtered enable signal is longer than a setting time of the current source of the clock generating circuit.

* * * * *